(12) United States Patent
Chu et al.

(10) Patent No.: US 9,899,482 B2
(45) Date of Patent: Feb. 20, 2018

(54) TUNNEL BARRIER SCHOTTKY

(71) Applicant: HRL Laboratories, LLC, Malibu, CA (US)

(72) Inventors: Rongming Chu, Agoura Hills, CA (US); Yu Cao, Agoura Hills, CA (US); Zijian Li, Thousand Oaks, CA (US); Adam J. Williams, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/093,710

(22) Filed: Apr. 7, 2016

(65) Prior Publication Data

US 2017/0047453 A1    Feb. 16, 2017

Related U.S. Application Data

(60) Provisional application No. 62/203,749, filed on Aug. 11, 2015.

(51) Int. Cl.
| | |
|---|---|
| *H01L 29/15* | (2006.01) |
| *H01L 29/205* | (2006.01) |
| *H01L 29/872* | (2006.01) |
| *H01L 29/66* | (2006.01) |
| *H01L 29/20* | (2006.01) |
| *H01L 29/06* | (2006.01) |

(52) U.S. Cl.
CPC ...... *H01L 29/205* (2013.01); *H01L 29/66212* (2013.01); *H01L 29/872* (2013.01); *H01L 29/0619* (2013.01); *H01L 29/2003* (2013.01)

(58) Field of Classification Search
CPC .......... H01L 29/2003; H01L 29/66462; H01L 29/7786; H01L 29/7787; H01L 29/205; H01L 29/4236; H01L 2924/00; H01L 29/66666; H01L 29/872; H01L 21/0254; H01L 29/66212; H01L 29/66522; H01L 21/0217

See application file for complete search history.

(56) References Cited

U.S. PATENT DOCUMENTS

| | | | |
|---|---|---|---|
| 2004/0080010 A1* | 4/2004 | Parikh | H01L 29/88 257/471 |
| 2013/0032821 A1 | 2/2013 | Lee | |
| 2013/0087878 A1* | 4/2013 | Edwards | H01L 29/47 257/472 |
| 2014/0051236 A1 | 2/2014 | Raj et al. | |
| 2014/0374769 A1* | 12/2014 | Brown | H01L 29/66143 257/76 |

OTHER PUBLICATIONS

International Search Report and Written Opinion for PCT Application No. US2016/027750, dated Jul. 20, 2016 (12 pages).

* cited by examiner

*Primary Examiner* — Robert Bachner
(74) *Attorney, Agent, or Firm* — Lewis Roca Rothgerber Christie, LLP

(57) ABSTRACT

A diode includes: a semiconductor substrate; a cathode metal layer contacting a bottom of the substrate; a semiconductor drift layer on the substrate; a graded aluminum gallium nitride (AlGaN) semiconductor barrier layer on the drift layer and having a larger bandgap than the drift layer, the barrier layer having a top surface and a bottom surface between the drift layer and the top surface, the barrier layer having an increasing aluminum composition from the bottom surface to the top surface; and an anode metal layer directly contacting the top surface of the barrier layer.

12 Claims, 11 Drawing Sheets

TUNNEL BARRIER SCHOTTKY

CROSS-REFERENCE TO RELATED APPLICATION

This application claims priority to and the benefit of U.S. Provisional Appl. No. 62/203,749, filed Aug. 11, 2015, the entire content of which is incorporated herein by reference.

STATEMENT REGARDING FEDERALLY SPONSORED RESEARCH OR DEVELOPMENT

The present invention was made with government support under Contract No. DE-AR0000450 awarded by the Department of Energy. The government has certain rights to the present invention.

BACKGROUND

1. Field

Aspects of embodiments of the present invention relate to Schottky structures and junction designs.

2. Description of Related Art

One difficulty encountered in GaN (gallium nitride) Schottky diodes is the reduction of the reverse leakage current. When using Schottky metals such as nickel (Ni) and platinum (Pt) that have Schottky barrier heights of less than 1 eV (electronvolt) on GaN, significant leakage current may arise when a reverse bias is applied to the diode. Using a p-n junction instead of a Schottky junction to form the diode may overcome this problem. For example, a GaN p-n junction has a barrier height of about 3 eV. This large barrier can significantly reduce the reverse leakage current. However, the drawback is that a forward bias greater than 3 V (volts) is needed to turn on the diode for forward conduction. The large turn-on voltage translates to undesirable large conduction power loss. As such, it would be desirable to achieve both low reverse leakage current and low turn-on voltage concurrently (e.g., simultaneously).

SUMMARY

Aspects of embodiments of the present invention are directed to Schottky structures and junction designs, such as a GaN (gallium nitride) vertical Schottky diode with a novel Schottky junction design. For example, embodiments of the present invention may use a novel Schottky barrier design in place of a GaN p-n junction for building a vertical diode. The Schottky junction may utilize a composition graded semiconductor layer to realize low leakage under reverse bias, yet low turn-on voltage under forward bias. Still further embodiments of the present invention are directed to a Schottky diode having reduced reverse leakage current, and without significantly increasing the forward turn-on voltage. Further embodiments are directed to a new barrier design that not only reduces the leakage, but also reduces the turn-on voltage.

According to an embodiment of the present invention, a diode is provided. The diode includes: a semiconductor substrate; a cathode metal layer contacting a bottom of the substrate; a semiconductor drift layer on the substrate; a graded aluminum gallium nitride (AlGaN) semiconductor barrier layer on the drift layer and having a larger bandgap than the drift layer, the barrier layer having a top surface and a bottom surface between the drift layer and the top surface, the barrier layer having an increasing aluminum composition from the bottom surface to the top surface; and an anode metal layer directly contacting the top surface of the barrier layer.

The aluminum composition of the barrier layer may be linearly graded from the bottom surface to the top surface.

The aluminum composition of the barrier layer may linearly increase from about 0% at the bottom surface to about 25% at the top surface.

The barrier layer may have a thickness of about 5 nanometers (nm).

According to another embodiment of the present invention, a semiconductor structure is provided. The semiconductor structure includes a semiconductor substrate, a semiconductor drift layer on the substrate, and a nitride semiconductor barrier layer on the drift layer and having a larger bandgap than the drift layer. The barrier layer has a top surface and a bottom surface between the drift layer and the top surface. A composition of the barrier layer is graded so that the bandgap of the barrier layer increases from a portion of the barrier layer near the bottom surface to a portion of the barrier layer near the top surface.

The barrier layer may include an ion implantation region at a peripheral portion of the barrier layer and a non-ion implanted region at a central portion of the barrier layer. The structure may further include an anode metal layer contacting a top surface of the barrier layer, covering the non-ion implanted region at the central portion of the barrier layer, and overlapping the ion implantation region at the peripheral portion of the barrier layer.

The structure may further include an anode metal layer contacting a top surface of the barrier layer and a cathode metal layer contacting a bottom of the substrate.

The substrate and the drift layer may include a III-nitride semiconductor.

The barrier layer may include aluminum gallium nitride (AlGaN). A composition of aluminum in the barrier layer may increase from the bottom surface to the top surface.

The barrier layer may have a thickness between 2.5 nanometers (nm) and 10 nm.

The barrier layer may contact the drift layer.

The drift layer may include a plurality of semiconductor drift layers.

The plurality of semiconductor drift layers may include a first drift layer on the substrate and a second drift layer on the first drift layer, the first drift layer having a higher doping concentration than the second layer.

According to yet another embodiment of the present invention, a method of making a semiconductor structure is provided. The method includes forming a semiconductor drift layer on a semiconductor substrate, and forming a nitride semiconductor barrier layer on the drift layer. The barrier layer has a larger bandgap than the drift layer. The barrier layer has a top surface and a bottom surface between the drift layer and the top surface. The forming of the barrier layer may include grading a composition of the barrier layer so that the bandgap of the barrier layer increases from a portion of the barrier layer near the bottom surface to a portion of the barrier layer near the top surface.

The method may further include: forming an ion implantation region at a peripheral portion of the barrier layer, leaving a non-ion implanted region at a central portion of the barrier layer; and forming an anode metal layer contacting a top surface of the barrier layer, covering the non-ion implanted region at the central portion of the barrier layer, and overlapping the ion implantation region at the peripheral portion of the barrier layer.

The method may further include forming an anode metal layer contacting the top surface of the barrier layer, and forming a cathode metal layer contacting a bottom of the substrate.

The barrier layer may include aluminum gallium nitride (AlGaN). The forming of the barrier layer may include grading a composition of the barrier layer so that a composition of aluminum in the barrier layer increases from a portion of the barrier layer near the bottom surface to a portion of the barrier layer near the top surface.

The forming of the barrier layer may include forming the barrier layer contacting the drift layer.

The method may further include forming a second semiconductor drift layer on the drift layer.

The second semiconductor drift layer may have a lower doping concentration than the drift layer.

The above and other embodiments of the present invention provide for a Tunnel-Barrier-Schottky (TBS) structure that concurrently (e.g., simultaneously) reduces both the reverse leakage current and the forward turn-on voltage. For example, such structures may be applicable to a wide variety of switching applications. Such a Schottky barrier design enables high-voltage and low-loss vertical diodes suitable for use in high-efficiency power electronic systems. These systems are important for virtually everything that uses electricity, such as airplanes, radar systems, automobiles, and consumer electronics.

BRIEF DESCRIPTION OF THE DRAWINGS

The accompanying drawings, together with the specification, illustrate example embodiments of the present invention. These drawings, together with the description, serve to better describe aspects and principles of the present invention.

DETAILED DESCRIPTION

Figure 1:
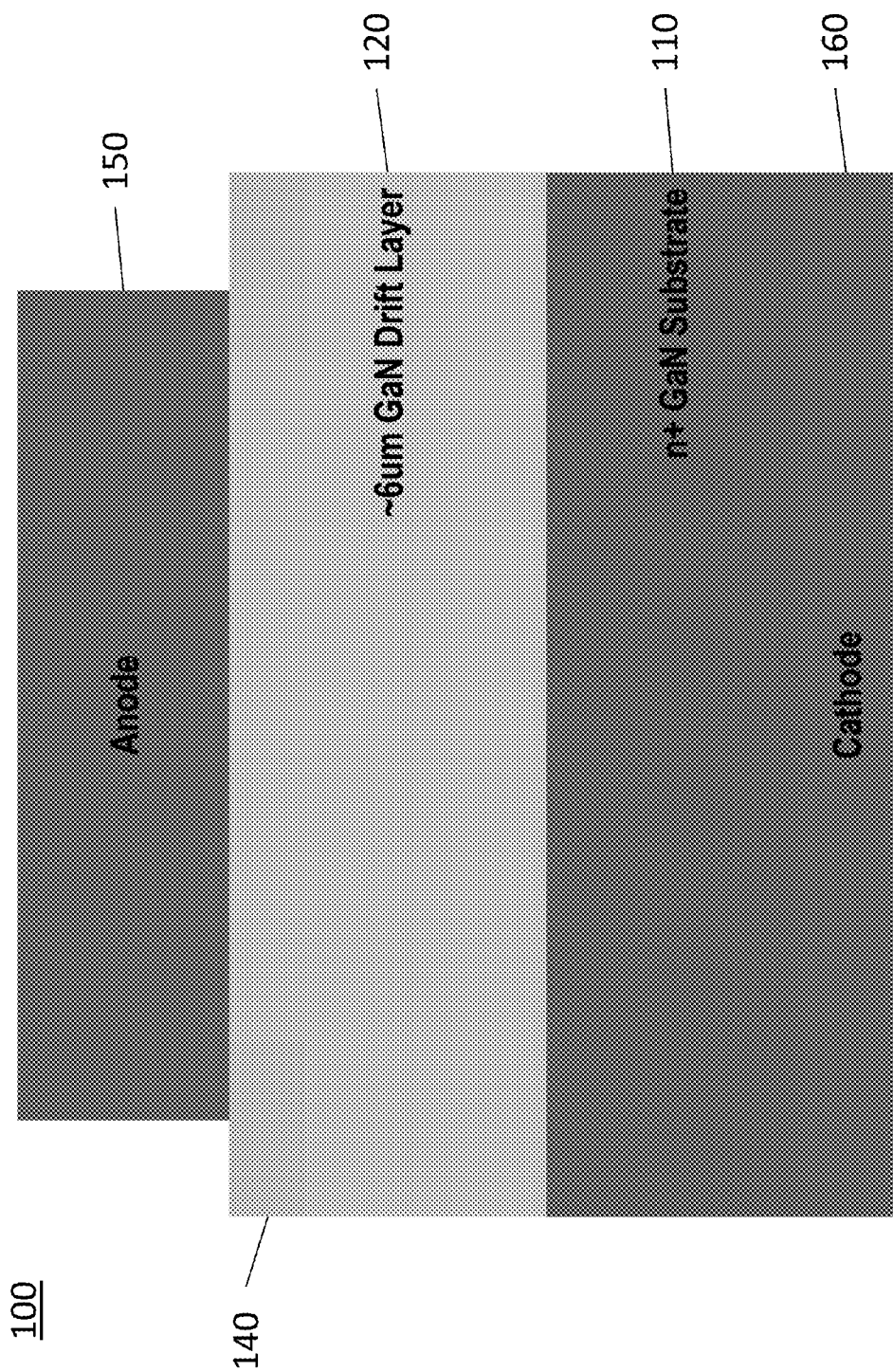
FIG. 1 is a schematic cross-section of a comparable Schottky diode.

The following description is provided to enable one of ordinary skill in the art to make and use embodiments of the present invention and to incorporate such embodiments in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the aspects, principles, and novel features disclosed herein.

In the detailed description that follows, numerous specific details are set forth in order to provide a more thorough understanding of some of the embodiments of the present invention. However, it will be apparent to one skilled in the art that the present invention may be practiced without necessarily being limited to these specific details. In other instances, well-known structures and devices may be shown in block diagram form, rather than in detail, in order to avoid obscuring aspects of the present invention.

The reader's attention is directed to all papers and documents that are filed concurrently with this specification and that are open to public inspection with this specification, and the contents of all such papers and documents are incorporated herein by reference. All the features disclosed in this specification (including any accompanying claims, abstract, and drawings) may be replaced by alternative features serving the same, equivalent, or similar purpose, unless expressly stated otherwise. Thus, unless expressly stated otherwise, each feature disclosed is only one example of a generic series of equivalent or similar features. Similarly, unless indicated to the contrary, features of one embodiment may be incorporated into other embodiments without departing from the spirit and scope of the present invention.

Furthermore, any element in a claim that does not explicitly state "means for"performing a specified function, or "step for" performing a specific function, is not to be interpreted as a "means" or "step" clause as specified in 35 U.S.C. § 112(f). In particular, the use of "step of" or "act of" in the claims herein is not intended to invoke the provisions of 35 U.S.C. § 112(f).

By way of example, various embodiments of the present invention are directed to a gallium nitride (GaN) vertical Schottky diode with a novel Schottky junction design. However, these embodiments are presented as examples and the present invention is not limited thereto.

Example embodiments of the present invention will now be described with reference to the accompanying drawings. In the drawings, the same or similar reference numerals refer to the same or similar elements throughout. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Embodiments of the present invention are directed to improved semiconductor device designs, such as for gallium nitride (GaN) vertical Schottky diodes having novel Schottky junction designs. For example, the Schottky junction may utilize a composition graded semiconductor layer to realize low leakage under reverse bias, yet low turn-on voltage under forward bias. This may reduce the reverse leakage current without significantly increasing the forward turn-on voltage.

By employing features such as a composition graded semiconductor layer—e.g., an aluminum gallium nitride (AlGaN) layer such as $Al_xGa_{1-x}N$, $0<x<1$, having aluminum nitride (AlN) and GaN in different proportions—embodiments of the Schottky junction may realize low leakage under reverse bias, yet have low turn-on voltage under forward bias. Further embodiments are directed to semiconductor device designs that reduce the reverse leakage current without significantly increasing the forward turn-on voltage. Still further embodiments are directed to a vertical Tunnel-Barrier-Schottky (TBS) structure that reduces the reverse leakage current and the forward turn-on voltage concurrently (e.g., simultaneously). Such a barrier design can be used in place of p-n junctions of comparable diodes.

GaN (gallium nitride) has high breakdown field and high electron mobility. These characteristics make GaN a promising candidate for power switching applications. The power diode is an important device for power switching. Embodiments of the present invention provide for a semiconductor structure, such as a GaN-based diode structure, that resolves technical difficulties encountered by previously reported GaN diodes.

Figure 2:
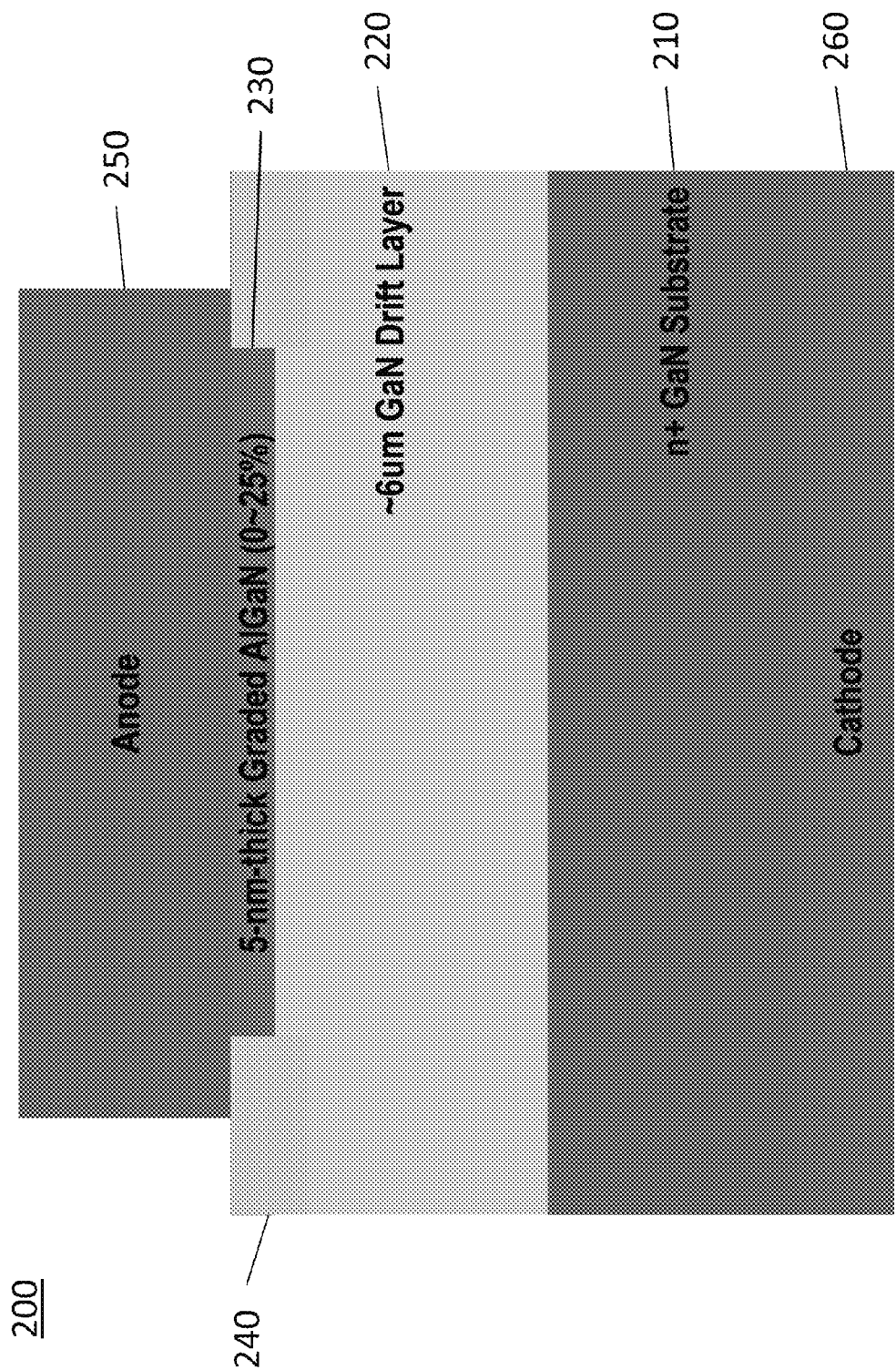
FIG. 2 is a schematic cross-section of a tunnel-barrier Schottky (TBS) diode according to an embodiment of the present invention.

FIG. 1 is a schematic cross-section of a comparable Schottky diode 100. FIG. 2 is a schematic cross-section of a tunnel-barrier Schottky (TBS) diode 200 according to an embodiment of the present invention.

Referring to FIG. 1, the comparable Schottky diode 100 includes an n-type GaN substrate 110, such as a heavily doped n-type GaN substrate 110. An n-type GaN drift layer 120 (such as a lightly doped n-type GaN drift layer 120) having an approximate thickness of 6 μm (micrometers) is on top of the GaN substrate 110. An ion (e.g., p-type) implantation region 140 is formed at the top edges of the GaN drift layer 120. An anode metal 150 is on top of the GaN drift layer 120, partially overlapping the implanted region 140. A cathode metal 160 is formed on the backside of the GaN substrate 110. Here, terms of relation such as "heavily doped" and "lightly doped" are intended to be interpreted in their normal meaning by someone of ordinary skill in the art to which the present application applies.

Referring to FIG. 2, the TBS diode 200 includes an n-type (e.g., heavily doped n-type) GaN semiconductor bottom layer or substrate 210. An n-type (e.g., lightly doped n-type) GaN semiconductor drift layer 220 having an approximate thickness of 6 μm (micrometers) is on top of the GaN substrate 210. A graded (e.g., linearly graded) aluminum gallium nitride (AlGaN) semiconductor barrier layer 230, such as AlGaN including both aluminum nitride (AlN) and gallium nitride (GaN), and having an approximate thickness of 5 nm (nanometers) is on top of the drift layer, with the aluminum composition graded from, for example, 0% at the bottom to 25% at the top.

Here, the aluminum composition refers to the percentage of aluminum in the overall metal content of the barrier layer. For example, in $Al_xGa_{1-x}N$, $0<x<1$, where $x=0.25$ and $1-x=0.75$ (e.g., AlN and GaN in proportion of 1 to 3 by mole ratio), the aluminum composition may be said to be 25%. Such grading may provide the semiconductor barrier layer 230 with a larger bandgap than that of the semiconductor drift layer 220, such as an increasing bandgap from a lower portion of the barrier layer 230 near a bottom surface of the barrier layer 230 to an upper portion of the barrier layer 230 near a top surface of the barrier layer 230.

Further, an ion implantation region 240 (such as a p-type ion implantation region) is formed at the edges of the AlGaN barrier layer 230 and top edges of the GaN drift layer 220, leaving a non-ion-implanted region at a central portion of the AlGaN barrier layer 230. An anode metal 250 is on top of (for example, in direct contact with) the AlGaN barrier layer 230, partially overlapping the implanted region 240 and completely covering the non-ion-implanted region. A cathode metal 260 is formed on the backside of the GaN substrate 210.

Figure 3:
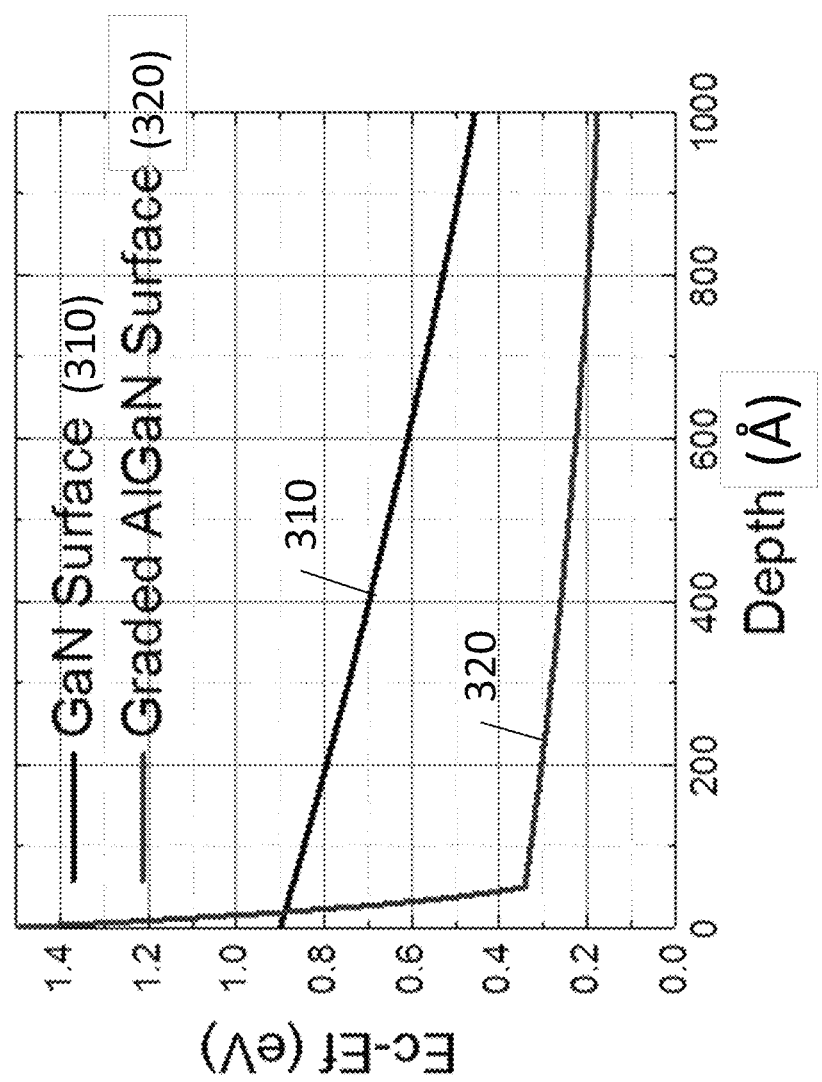
FIG. 3 is a graph illustrating the simulated conduction band edge diagrams of the diodes of FIGS. 1-2.

FIG. 3 is a graph illustrating the simulated conduction band edge diagrams (band diagrams) 310 and 320 of the diodes of FIGS. 1-2, with curve 310 representing the band diagram of the comparable Schottky diode 100 of FIG. 1 and curve 320 representing the band diagram of the TBS diode 200 of FIG. 2.

In FIG. 3, the x-axis represents depth (measured from the top of the GaN drift layer for the comparable diode 100 of FIG. 1 and from the top of the AlGaN barrier layer for the TBS diode 200 of FIG. 2) in angstroms (Å) while the y-axis represents electron energy ($E_C$-$E_F$, expressed in eV, where $E_C$ is the conduction band edge and $E_F$ is the Fermi level). As can be observed in FIG. 3, the TBS diode 200 of FIG. 2 (curve 320) has about 0.5 eV higher Schottky barrier than the comparable diode 100 of FIG. 1 (curve 310). The higher Schottky barrier reduces leakage current under reverse bias. When the TBS diode is forward biased, however, electrons can accumulate in the near surface region under relatively small bias. Accumulation of electrons in the near surface region makes it easy for electrons to tunnel through the surface barrier, forming forward conduction current.

FIGS. 4-7 illustrate a process flow of making a GaN TBS diode 200 according to an embodiment of the present invention. It should be noted that FIGS. 4-7 illustrate an example order of the steps, but the present invention is not limited thereto. In other embodiments, the steps may be reversed or have a different order. Further, some of the steps may be left out.

Figure 4:
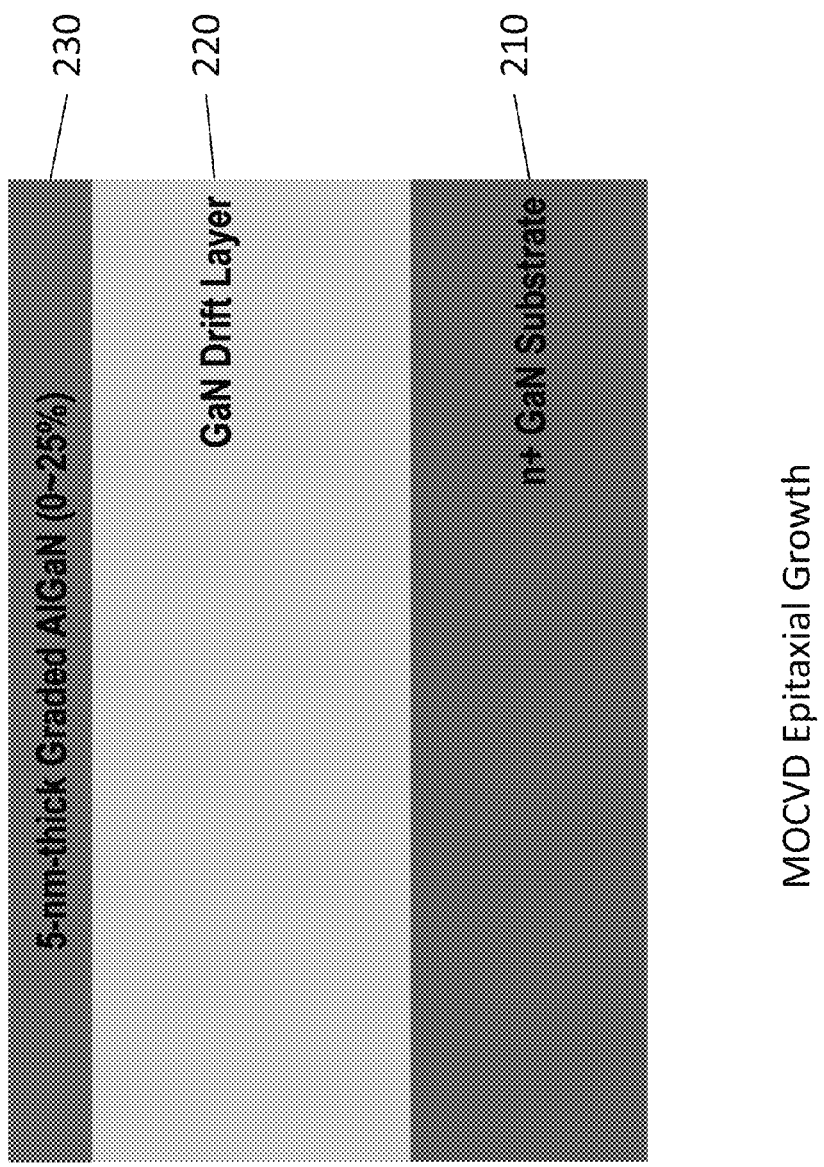
FIGS. 4-7 illustrate a process flow of making a GaN TBS diode according to an embodiment of the present invention.

Referring to FIG. 4, a starting wafer of a GaN bulk substrate 210 may be used. For example, the GaN substrate 210 may be 300 μm thick. According to some embodiments, the GaN substrate 210 may be between 100 μm and 300 μm, as reduced thickness of the GaN substrate may provide for reduced electrical and thermal resistance. Accordingly, in still further embodiments, the GaN substrate 210 is less than 100 μm thick, but still thick enough to provide structural integrity and mechanical support for the rest of the semiconductor device, as would be apparent to one of ordinary skill. In other embodiments, another III-nitride semiconductor may be used for the substrate, such as boron nitride (BN), AlN, or indium nitride (InN).

The GaN substrate 210 may be n-type, such as heavily doped n-type (n+ type), and may have low resistivity. A GaN drift layer 220 may be grown on top of the GaN substrate 210. The drift layer 220 may be n-type, like the GaN substrate 210, only less lightly doped n-type and have higher resistivity than the GaN bottom layer or substrate 210 (e.g., the GaN drift layer 220 may have a substantially lower doping concentration than the GaN substrate 210). The GaN drift layer 220 may have a uniform or near uniform thickness of somewhere between 0.1 μm and 100 μm, such as 6 μm, depending on factors such as the target blocking voltage. In other embodiments, the drift layer may be between 0.01 μm and 1000 μm.

A graded (e.g., linearly graded) AlGaN layer 230 (an alloyed mixed crystal of AlN and GaN), which acts as a barrier layer (e.g., a nitride semiconductor barrier layer), is grown on top of the drift layer 220, with a composition of aluminum graded from, for example, 0% at the bottom (e.g., closer or proximal to the drift layer 220) to 25% at the top (e.g., farther or distal from the drift layer 220). The grading may be linear, nonlinear, in steps, or variations thereof. In other embodiments, the barrier layer may be composed of other semiconductor alloys such as aluminum indium nitride (AlInN) or aluminum indium gallium nitride (AlInGaN), as long as its energy bandgap may be graded from a smaller value at the bottom to a larger value at the top. The energy bandgap at the top surface of the barrier layer may be larger than the bandgap of the drift layer. Here, the aluminum composition refers to the percentage of metal (e.g., Al, In, Ga) in the barrier layer (by mole fraction) that is aluminum.

In some embodiments, the grading will include one or more gradual increases in aluminum composition from bottom to top, although variations might be present. For example, in some embodiments, the aluminum composition by mole fraction may be between 0% and 10% at the bottom, and between 15% and 55% at the top. Other compositions are also possible.

The AlGaN barrier layer 230 may be, for example, 5 nm thick. In other embodiments, the AlGaN barrier layer 230 may be between 4 nm and 6 nm thick. In still other embodiments, the AlGaN barrier layer 230 may be between 2.5 nm and 10 nm thick. In yet still other embodiments, the AlGaN barrier layer 230 may be between 1 nm and 20 nm thick. The AlGaN layer forms a larger barrier height to the anode Schottky metal, which may result in smaller reverse leakage current caused by thermionic emission.

Figure 5:
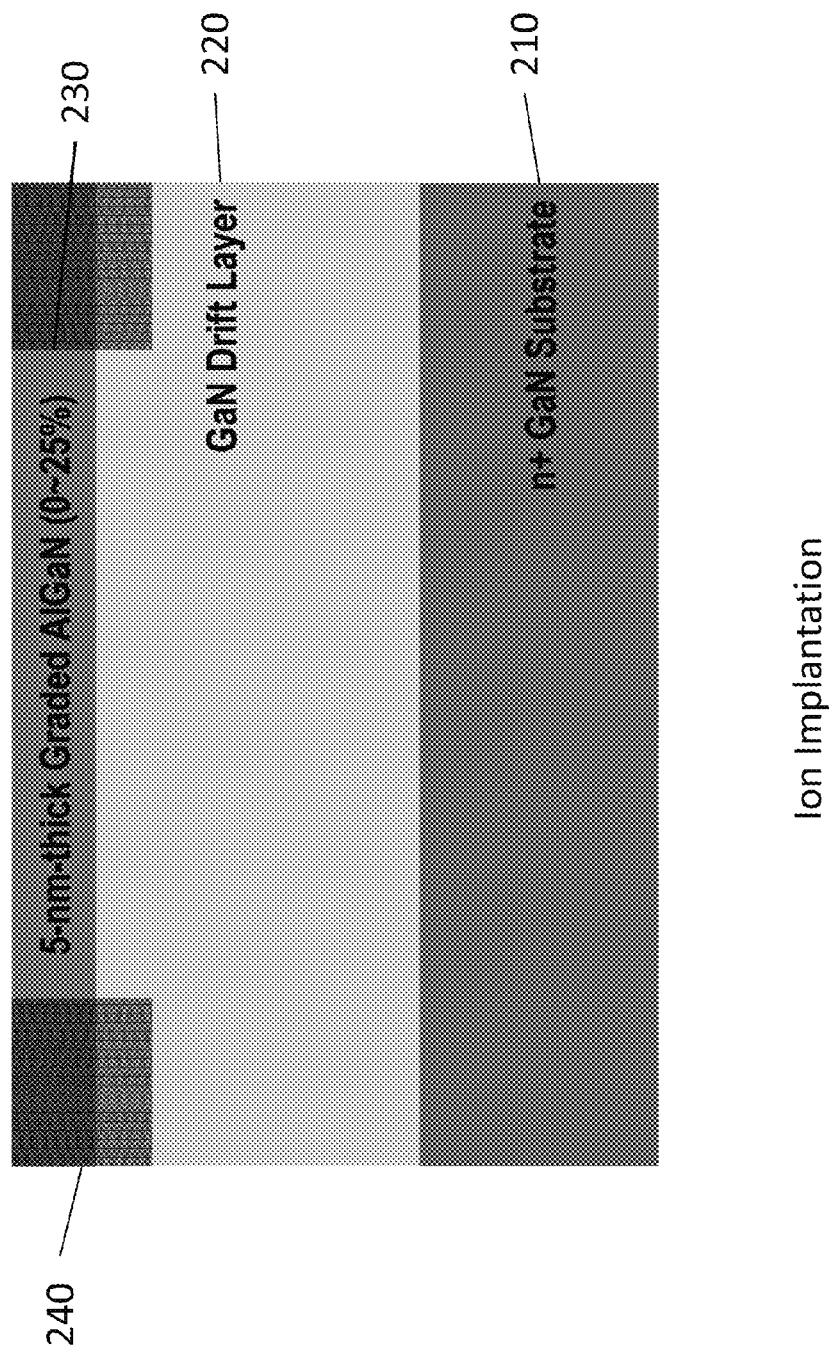

Referring to FIG. 5, ion implantation 240 (such as with p-type ions) is applied to the front side of the wafer. The ion implantation 240 may include species such as iron (Fe), aluminum (Al), magnesium (Mg), helium (He), and nitrogen (N), but the present invention is not limited thereto, and may form an ion implantation region 240 at edges (e.g., a peripheral portion) of the barrier layer 230 and at top edges of the drift layer 220, leaving a non-ion implanted region at a central portion of the barrier layer 230. The ion implantation at the edges helps to reduce the electric field crowding. The ion implantation may be p-type. The ion implantation may also include elements that introduce deep level trap states in the bandgap, which may help reduce the mobile electron concentration and reduce the electric field crowding.

Figure 6:
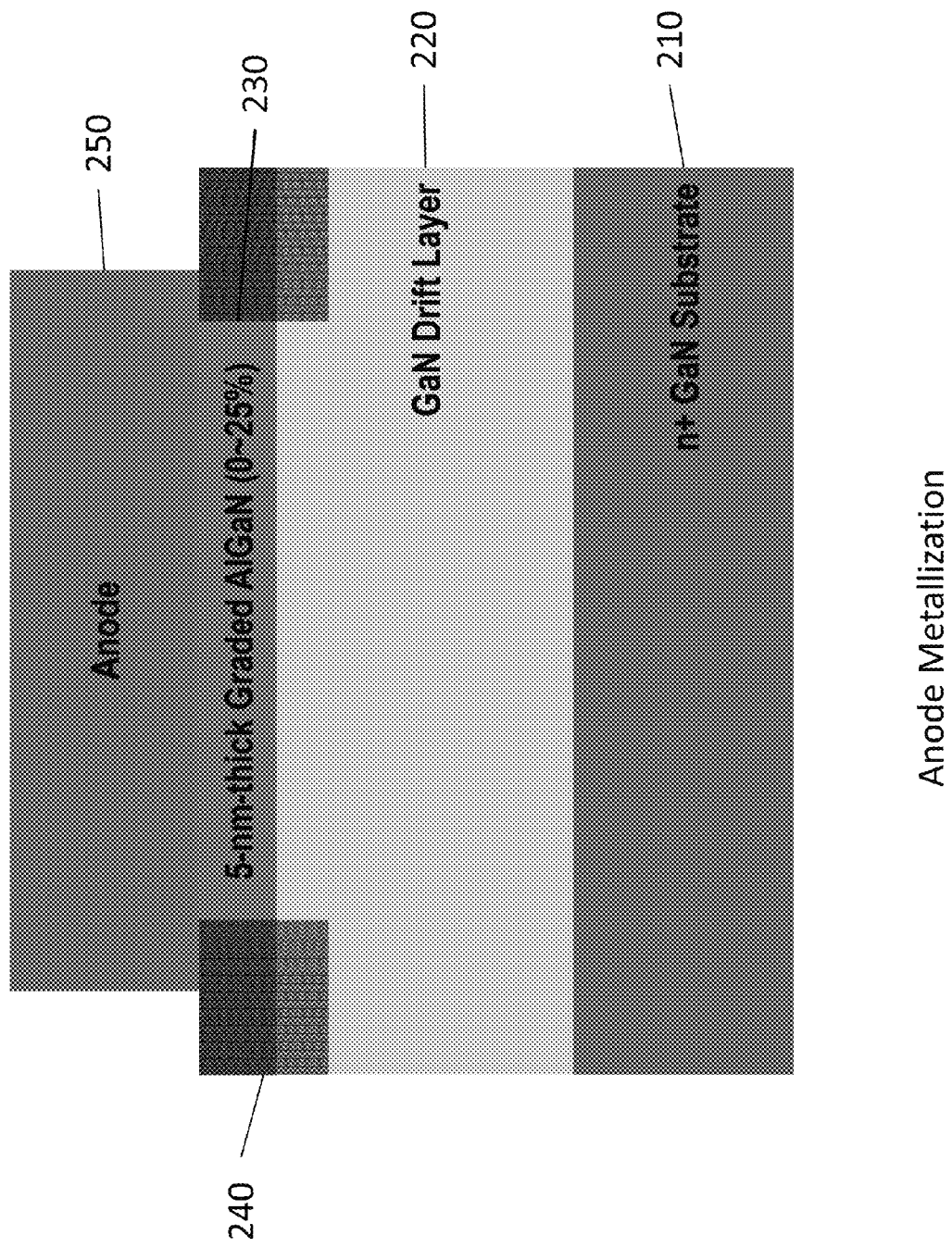
Figure 7:
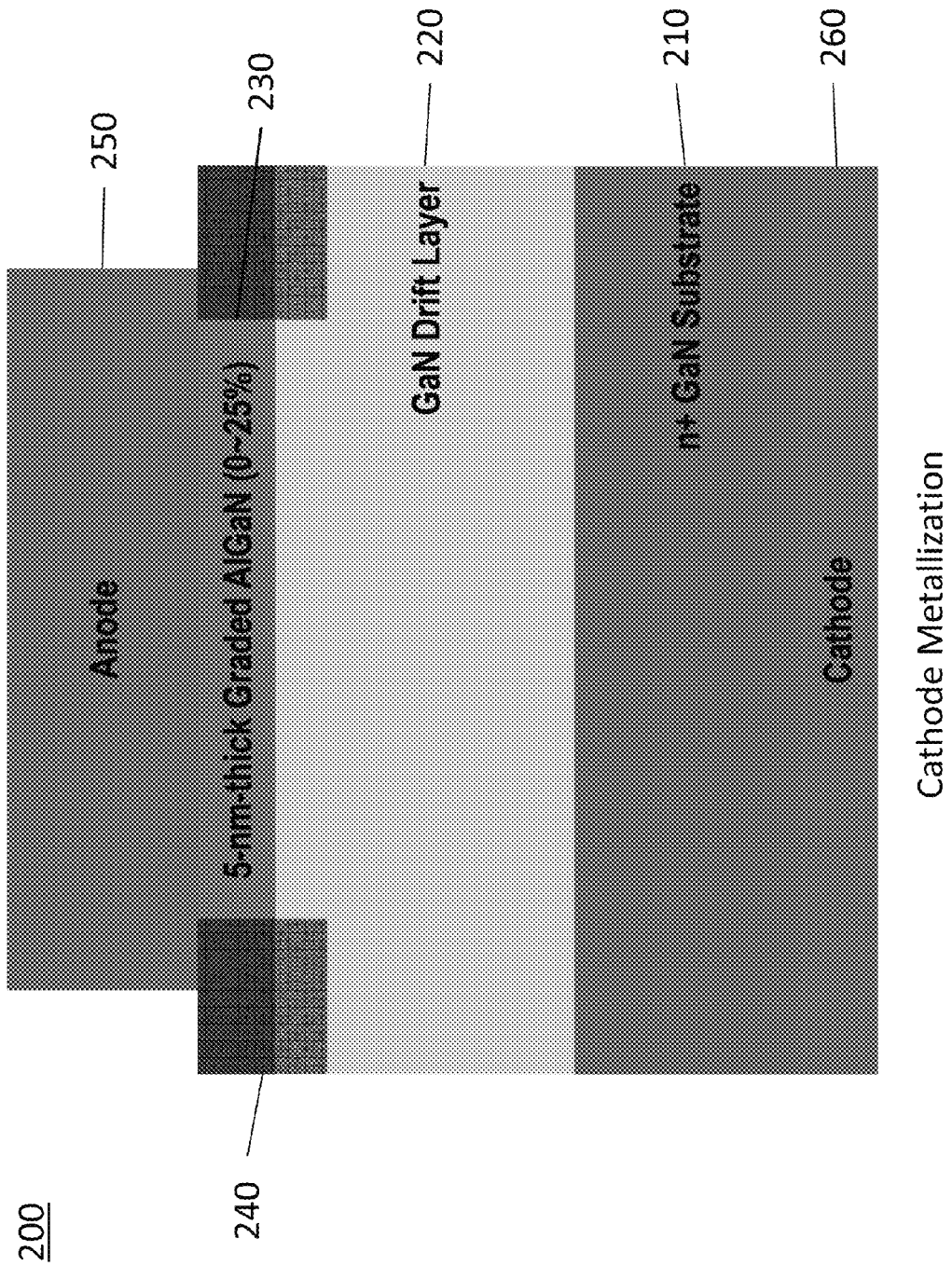

Referring to FIG. 6, an anode metal (or anode metal layer) 250 may be formed on the front side of the wafer. A high work function metal, for example, nickel (Ni), platinum (Pt), or gold (Au), may be used for making the anode. There may be an overlap between the anode metal 250 and the implanted region 240 to mitigate electric field crowding at the edge of the anode metal 250. The anode metal 250 may completely cover and be in direct contact with the non-implanted region. Referring to FIG. 7, a cathode metal (or cathode metal layer) 260 may be formed on the backside of the wafer. A low work function metal, for example, titanium (Ti) or aluminum (Al) may be used for making the cathode. For lower contact resistance, a dry etch of the backside GaN surface may be performed before the cathode metallization 260.

In order to verify the influence of the tunnel-barrier-Schottky design, two diodes were fabricated: a comparable GaN Schottky diode 100 (see FIG. 1) and a GaN TBS diode 200 (see FIG. 2). The two diodes 100 and 200 have the same device structure and process conditions, except that the TBS diode 200 has an additional 5 nm graded (0% to 25% aluminum) AlGaN layer 230 on the surface of the semiconductor.

Figure 8:
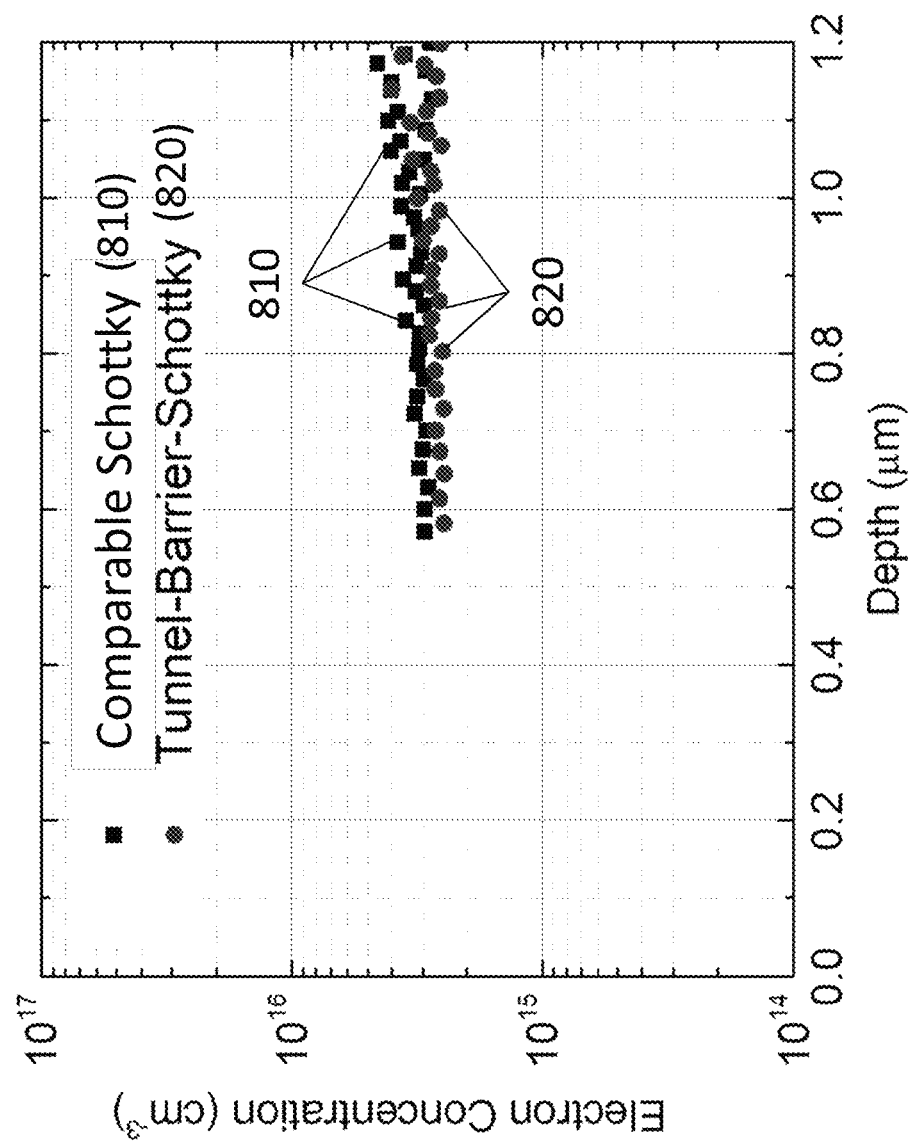
FIG. 8 is a graph of the electron concentration profiles in the GaN drift layers of the two diodes of FIGS. 1-2 as extracted from capacitance-voltage measurements.

FIG. 8 is a graph of the electron concentration profiles 810 and 820 in the GaN drift layers 120 and 220 of the two diodes 100 and 200 of FIGS. 1-2, respectively, as extracted from capacitance-voltage measurements.

Referring to FIG. 8, the x-axis is the depth in μm (micrometers) in the GaN drift layer while the y-axis is the electron concentration in electrons per $cm^3$ (cubic centimeter). As can be observed from FIG. 8, under small forward bias, there is electron accumulation in the region close to the AlGaN surface. Electrons can tunnel through the large (yet thin) energy barrier and form forward conduction current. In addition, the comparable Schottky diode electron concentration 810 is almost the same as that of the TBS diode electron concentration 820, confirming that the corresponding GaN drift layers 120 and 220 are substantially the same.

Figure 9:
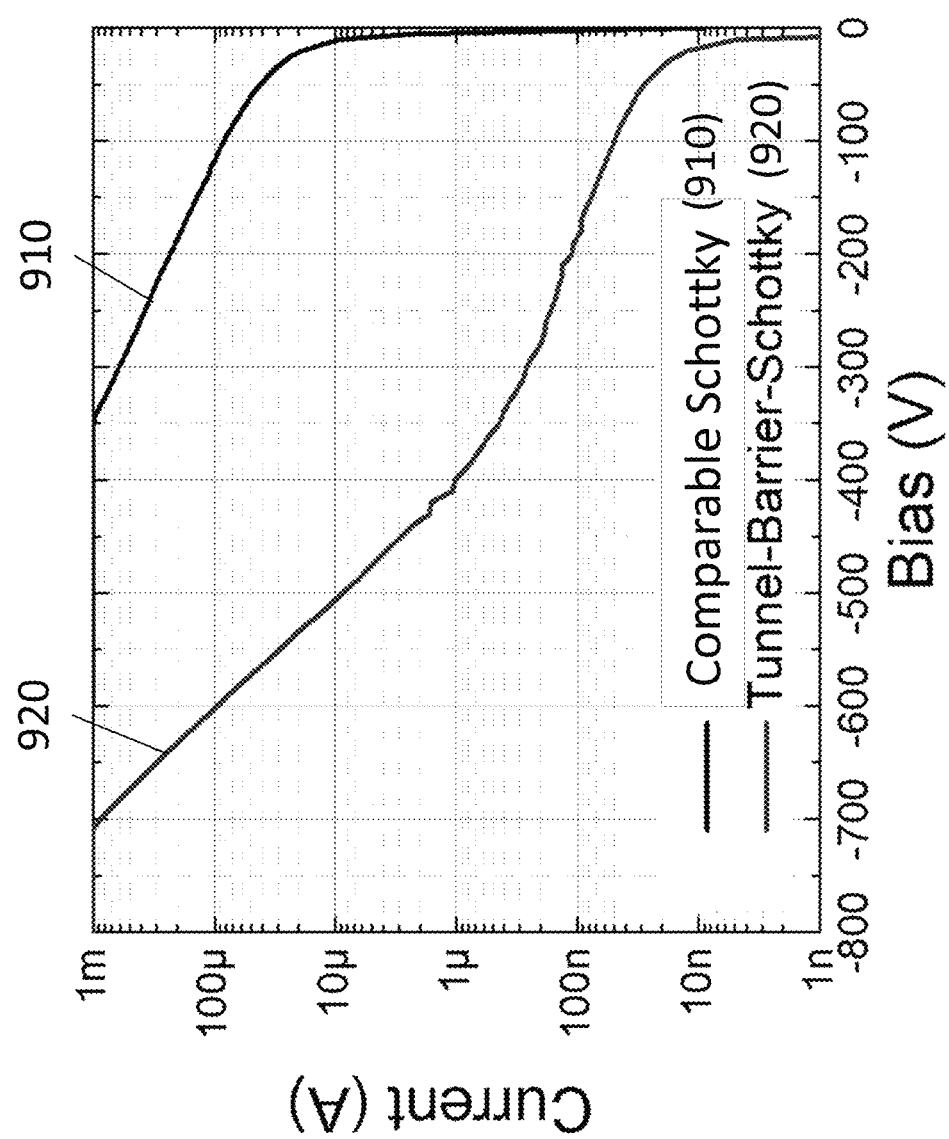
FIG. 9 is a graph comparing the reverse leakage characteristics of the two diodes of FIGS. 1-2.

FIG. 9 is a graph comparing the reverse leakage characteristics 910 and 920 of the two diodes 100 and 200 of FIGS. 1-2, respectively. Data in FIGS. 9-10 was collected using a Semiconductor Parameter Analyzer.

Referring to FIG. 9, the x-axis represents the reverse bias in volts (V) while the y-axis represents the leakage current in amperes (A), such as nA (nanoamperes), μA (microamperes), and mA (milliamperes). With the TBS design 200 of FIG. 2, the reverse leakage current 920 is over three orders of magnitude (1000 times) lower than the reverse leakage current 910 of the comparable Schottky diode 100 of FIG. 1. The lower reverse leakage current 920 may be attributed to the larger Schottky barrier height on the surface of the AlGaN barrier layer 230 (in the TBS diode 200) versus the surface of the GaN drift layer 120 (in the comparable Schottky diode 100).

Figure 10:
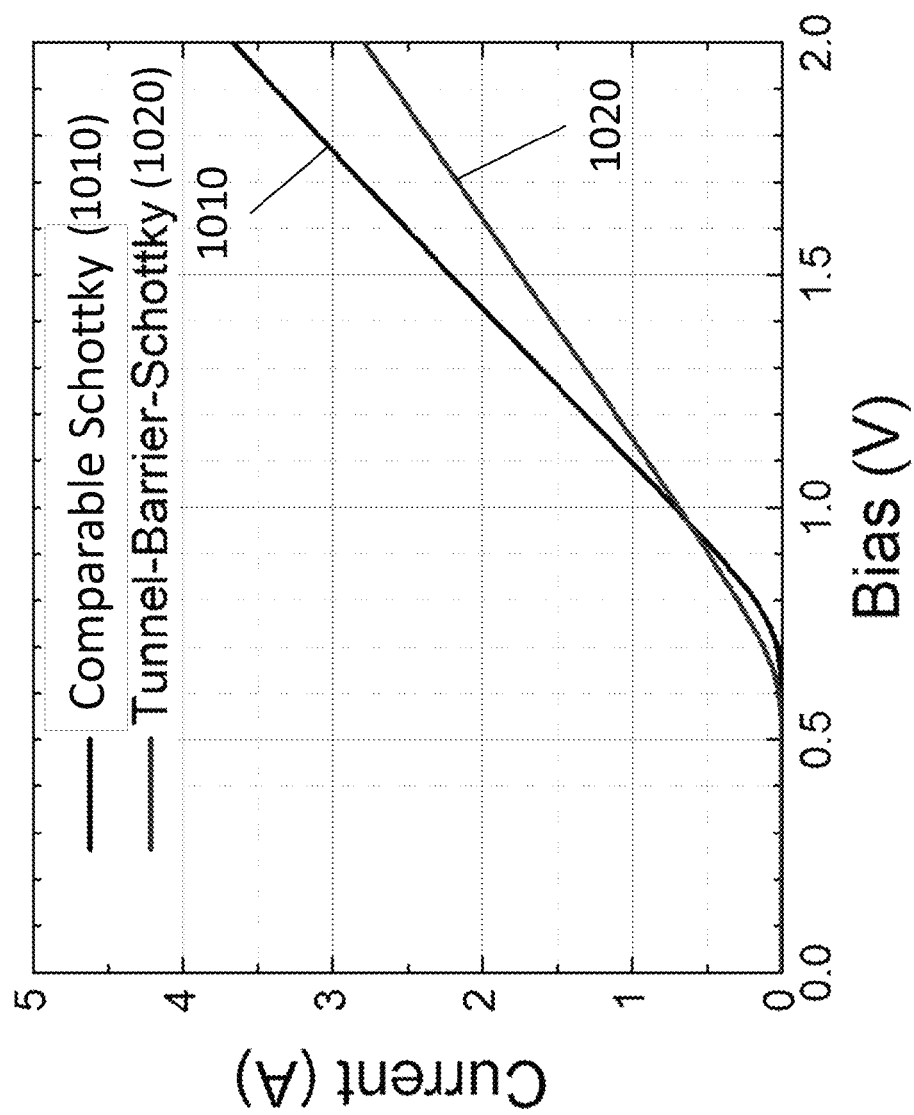
FIG. 10 is a graph comparing the forward current-voltage characteristics of the two diodes of FIGS. 1-2.

FIG. 10 is a graph comparing the forward current-voltage characteristics 1010 and 1020 of the two diodes 100 and 200 of FIGS. 1-2, respectively.

Referring to FIG. 10, the x-axis represents the forward bias or turn-on voltage in volts (V) while the y-axis represents the forward current in amperes (A). It is observed that in spite of the larger Schottky barrier height, the TBS design 200 resulted in even lower turn-on voltage 1020 than the turn-on voltage 1010 of the comparable Schottky diode 100. This is because only a small forward bias is needed to accumulate electrons in the surface region of the TBS diode 200, which tunnels through the large barrier to form conduction current. Low turn-on voltage is highly preferred for achieving low conduction loss. It is also observed that the TBS diode 200 has a larger on-resistance than that of the comparable Schottky diode 100. The larger on-resistance may be due to the tunneling resistance.

It should be noted that the present invention is not limited to the above-disclosed embodiments. For example, the present invention is not limited to GaN-based layers. In other embodiments, any conductive III-nitride or III-nitride semiconductor may be used, such as aluminum nitride (AlN), indium nitride (InN), boron nitride (BN) or combinations thereof (possibly including gallium nitride as well).

Figure 11:
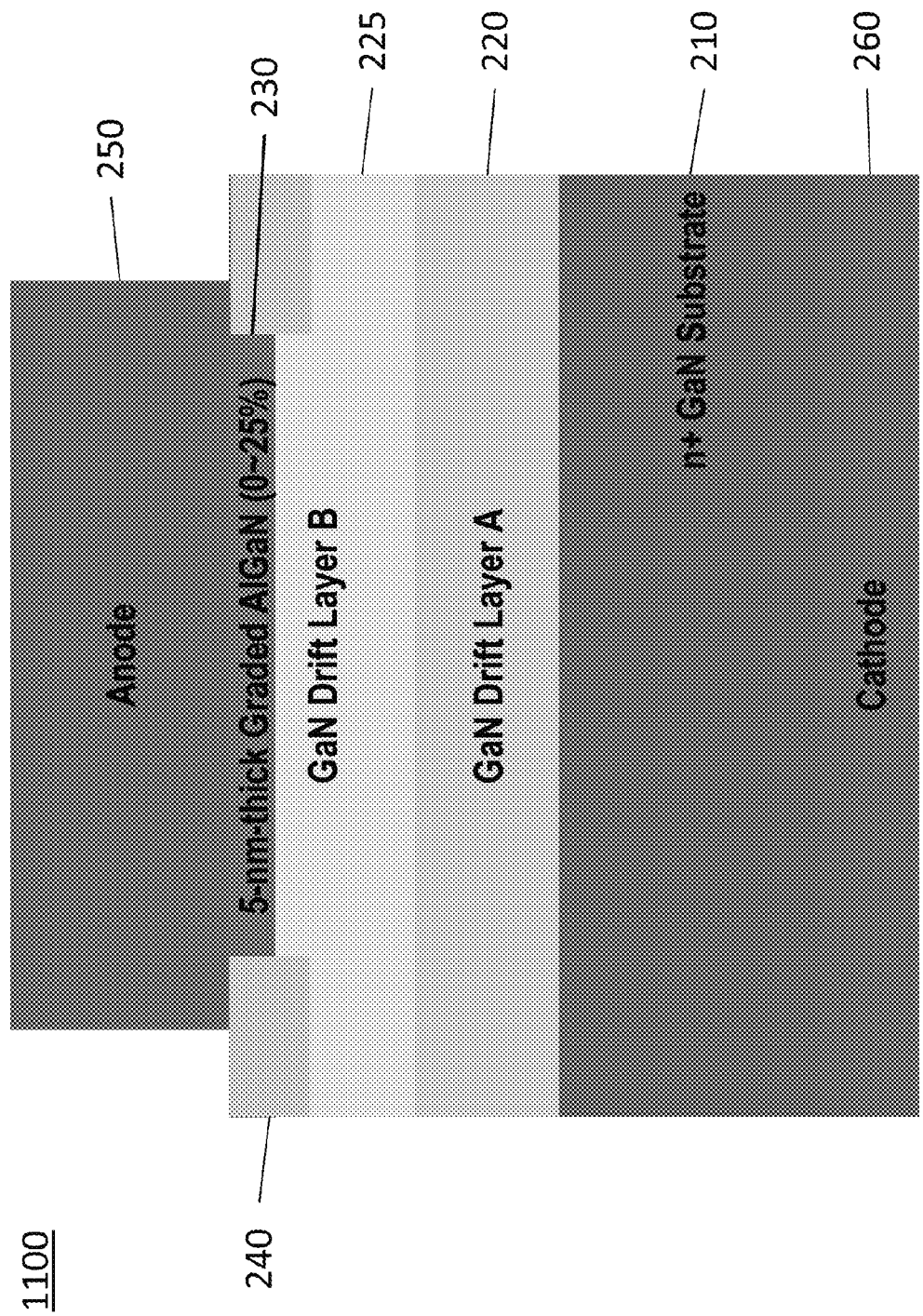
FIG. 11 is a schematic cross-section of a tunnel-barrier Schottky (TBS) diode according to another embodiment of the present invention.

FIG. 11 is a schematic cross-section of a tunnel-barrier Schottky (TBS) diode 1100 according to another embodiment of the present invention. The TBS diode 1100 of FIG. 11 may share many of the same or similar features of the TBS diode 200 of FIG. 2. Accordingly, duplicate descriptions of such features may be omitted.

Referring to FIG. 11, the TBS diode 1100 includes a second GaN drift layer 225 that may be grown on top of the (first) GaN drift layer 220. The second drift layer 225 may be n-type (such as lightly doped n-type), like the first GaN drift layer 220, and may even be less doped than the first GaN drift layer 220 (e.g., the first draft layer 220 may have a higher doping concentration than the second drift layer 225). The second GaN drift layer 225 may have a uniform or near uniform thickness of somewhere between 0.1 μm and 100 μm, such as 6 μm, depending on factors such as the target blocking voltage. In other embodiments, the second GaN drift layer 225 may be between 0.01 μm and 1000 μm. In other embodiments, a plurality of such semiconductor drift layers 225 may be present in addition to the first GaN drift layer 220. Further, each of the additional drift layers may have progressively less n-type doping than the preceding drift layer, such that the doping concentrations of the drift layers decreases from the substrate 210 (or cathode end) to the barrier layer 230 (or anode end).

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A diode comprising:
a semiconductor substrate;
a cathode metal layer contacting a bottom of the substrate;
a semiconductor drift layer on the substrate;
a graded aluminum gallium nitride (AlGaN) semiconductor barrier layer on the drift layer and having a larger bandgap than the drift layer, the barrier layer having a top surface and a bottom surface between the drift layer and the top surface, the barrier layer having an increasing aluminum composition from the bottom surface to the top surface; and
an anode metal layer directly contacting the top surface of the barrier layer,
wherein the barrier layer comprises an ion implantation region at a peripheral portion of the barrier layer and a non-ion implanted region at a central portion of the barrier layer, and
the anode metal layer completely covers the non-ion implanted region of the barrier layer, and overlaps the ion implantation region at the peripheral portion of the barrier layer.

2. The diode of claim 1, wherein the aluminum composition of the barrier layer is linearly graded from the bottom surface to the top surface.

3. The diode of claim 2, wherein the aluminum composition of the barrier layer linearly increases from about 0% at the bottom surface to about 25% at the top surface.

4. The diode of claim 1, wherein the barrier layer has a thickness of about 5 nanometers (nm).

5. A semiconductor structure comprising:
a semiconductor substrate;
a semiconductor drift layer on the substrate; and
a nitride semiconductor barrier layer on the drift layer and having a larger bandgap than the drift layer, the barrier layer having a top surface and a bottom surface between the drift layer and the top surface,
wherein a composition of the barrier layer is graded so that the bandgap of the barrier layer increases from a portion of the barrier layer near the bottom surface to a portion of the barrier layer near the top surface,
wherein the barrier layer comprises an ion implantation region at a peripheral portion of the barrier layer and a non-ion implanted region at a central portion of the barrier layer, and
the structure further comprises an anode metal layer contacting a top surface of the barrier layer, completely covering the non-ion implanted region of the barrier layer, and overlapping the ion implantation region at the peripheral portion of the barrier layer.

6. The structure of claim 5, further comprising:
a cathode metal layer contacting a bottom of the substrate.

7. The structure of claim 5, wherein the substrate and the drift layer comprise a III-nitride semiconductor.

8. The structure of claim 5, wherein
the barrier layer comprises aluminum gallium nitride (AlGaN), and
a composition of aluminum in the barrier layer increases from the bottom surface to the top surface.

9. The structure of claim 8, wherein the barrier layer has a thickness between 2.5 nanometers (nm) and 10 nm.

10. The structure of claim 5, wherein the barrier layer contacts the drift layer.

11. A semiconductor structure comprising:
a semiconductor substrate;
a semiconductor drift layer on the substrate; and
a nitride semiconductor barrier layer on the drift layer and having a larger bandgap than the drift layer, the barrier layer having a top surface and a bottom surface between the drift layer and the top surface,
wherein a composition of the barrier layer is graded so that the bandgap of the barrier layer increases from a portion of the barrier layer near the bottom surface to a portion of the barrier layer near the top surface, and
wherein the drift layer comprises a plurality of semiconductor drift layers.

12. The structure of claim 11, wherein the plurality of semiconductor drift layers comprises a first drift layer on the substrate and a second drift layer on the first drift layer, the first drift layer having a higher doping concentration than the second layer.

* * * * *